United States Patent [19]

Okada

[11] Patent Number: 5,440,323
[45] Date of Patent: Aug. 8, 1995

[54] DRIVE CIRCUIT FOR A DISPLAY APPARATUS HAVING SIGNAL VOLTAGE CIRCUITS SELECTIVELY CONTROLLED BY SELECTION SIGNAL

[75] Inventor: Hisao Okada, Ikoma, Japan

[73] Assignee: Sharp Kabushiki Kaisha, Osaka, Japan

[21] Appl. No.: 767,340

[22] Filed: Sep. 27, 1991

[30] Foreign Application Priority Data

Sep. 28, 1990 [JP] Japan .................................. 2-261472

[51] Int. Cl.[6] .............................................. G09G 3/36
[52] U.S. Cl. ...................................... 345/100; 345/98
[58] Field of Search ............... 340/811, 784, 789, 793, 340/719, 718; 358/236, 59; 345/90, 88, 99, 100, 94, 95, 96, 103, 76, 80; 348/793, 792, 800, 790

[56] References Cited

U.S. PATENT DOCUMENTS

| | | | |
|---|---|---|---|
| 4,799,057 | 1/1989 | Takeda et al. | 340/811 |
| 4,870,399 | 9/1989 | Carlson | 340/811 |
| 5,017,914 | 5/1991 | Uchida et al. | 340/811 |
| 5,061,920 | 10/1991 | Nelson | 340/811 |
| 5,070,255 | 12/1991 | Shin | 340/784 |
| 5,101,116 | 3/1992 | Morokawa | 340/811 |
| 5,111,195 | 5/1992 | Fukuoka et al. | 340/811 |

FOREIGN PATENT DOCUMENTS

| | | |
|---|---|---|
| 2507366 | 6/1982 | France . |
| 2102176 | 1/1983 | United Kingdom . |
| 2162984 | 2/1986 | United Kingdom . |

*Primary Examiner*—Jeffery Brier
*Assistant Examiner*—A. Au
*Attorney, Agent, or Firm*—David G. Conlin; George W. Neuner

[57] ABSTRACT

A drive circuit for a display apparatus having parallel signal electrodes has at least one voltage selecting circuit, a plurality of signal voltage circuits, and one selection signal circuit. The voltage selecting circuit selects one of voltages having different levels in accordance with an input digital video signal. The signal voltage circuits are respectively provided for the signal electrodes, and include one signal line which is disposed between the voltage circuit and the respective signal electrode. The signal line is provided with an input switch, a capacitor and an output switch. The selection signal circuit generates a signal for controlling the input switches of the signal voltage circuits to be sequentially closed.

14 Claims, 16 Drawing Sheets

DRIVE CIRCUIT FOR A DISPLAY APPARATUS HAVING SIGNAL VOLTAGE CIRCUITS SELECTIVELY CONTROLLED BY SELECTION SIGNAL

BACKGROUND OF THE INVENTION

1. Field of the Invention

This invention relates to a drive circuit for a display apparatus, and more particularly to a drive circuit for a display apparatus which is capable of gray-scale display by means of amplitude modulation. In this specification, a matrix type liquid crystal display apparatus will be described as a typical example of a display apparatus, but this invention can also be applied to drive circuits for other types of display apparatus such as electroluminescent (EL) display apparatus and plasma display apparatus.

2. Description of the Prior Art

When driving a liquid crystal display (LCD) apparatus, since the speed of response of a liquid crystal is very slow as compared with a luminescent material used in a cathode ray tube (CRT) display apparatus, a special drive circuit is used. That is, in the drive circuit for the LCD apparatus, video signals which are sequentially sent are not immediately supplied to respective pixels, but the video signals are sampled for each of the respective pixels in one horizontal period and held for the horizontal period. The held video signals are output at the same time at the beginning of the next horizontal period, or at an appropriate point of time in the next horizontal period. After the output of video signal voltages to the respective pixels are begun, the signal voltages are held for a period of time sufficiently over the speed of response of the liquid crystal.

In order to hold the signal voltages, a prior art drive circuit utilizes capacitors. FIG. 11 shows a signal voltage output circuit (a source driver) for supplying drive voltages to N pixels on one scanning line selected by a scanning signal. A portion for the nth pixel of the signal voltage output circuit is shown in FIG. 12. The portion includes an analog switch $SW_1$, a sampling capacitor $C_{SMP}$, an analog switch $SW_2$, a holding capacitor $C_H$, and an output buffer amplifier A. The operation of the signal voltage output in the prior art will be described with reference to the circuit diagrams of FIGS. 11 and 12, and also to the signal timing chart of FIG. 13. Analog video signals $v_s$ to be input to the analog switches $SW_1$ are sequentially sampled in accordance with sampling clock signals $T_{SMP1}$-$T_{SMPN}$ which correspond to the respective N pixels on one scanning line selected by each horizontal synchronizing signal $H_{syn}$. By this sampling, the sequential instantaneous voltages $V_{SMP1}$-$V_{SMPN}$ of the video signals $v_s$ are applied to the corresponding sampling capacitors $C_{SMP}$. The nth sampling capacitor $C_{SMP}$ is charged up to the value of the video signal voltage $V_{SMPn}$ corresponding to the nth pixel, and holds this value. The signal voltages $V_{SMP1}$-$V_{SMPN}$ which are sequentially sampled and held in one horizontal period are transferred from the sampling capacitors $C_{SMP}$ to the holding capacitors $C_H$, in response to an output pulse OE which is supplied to all of the analog switches $SW_2$ at the same time. Then the signal voltages $V_{SMP1}$-$V_{SMPN}$ are output to source lines $O_1$-$O_N$ connected to the respective pixels through the buffer amplifiers A.

To the drive circuit described above, analog video signals are supplied. Such a drive circuit presents the following problems (A1) to (A4) when attempts are made to increase the size or improve the resolution of a liquid crystal panel.

(A1) When the charges in the sampling capacitors $C_{SMP}$ are transferred to the holding capacitors $C_H$, the relationship between the voltage $V_H$ of the holding capacitor $C_H$ and the sampled voltage $V_{SMP}$ is represented by the following expression:

$$V_H = \frac{1}{1 + \frac{C_H}{C_{SMP}}} \cdot V_{SMP}$$

Accordingly, in order that the voltage $V_H$ held by the holding capacitor $C_H$ may substantially equal the sampled voltage $V_{SMP}$, a condition of $C_{SMP} >> C_H$ is required to be satisfied. That is, it is necessary to use the sampling capacitor $C_{SMP}$ of a relatively large capacitance. However, if the capacitance of the sampling capacitor $C_{SMP}$ is too large, it is necessary to make the time for charging (i.e. a sampling period) longer. On the contrary, as the size of the LCD apparatus is made larger or the resolution is improved, the number of pixels corresponding to one horizontal period increases, thereby necessitating a sampling period to be shortened, in reverse proportion. It can be seen that there is a limit to the increase in size or the improvement in resolution of the LCD apparatus.

(A2) Analog video signals are supplied to the source driver via bus lines. As the size and resolution of a display apparatus are increased, the frequency band of the video signal becomes wider and the distribution capacity of the bus lines increases. This results in the necessity of a wideband amplifier in the circuit supplying video signals, thereby increasing the cost of production.

(A3) In a color display apparatus in which RGB video signals are used, bus lines for supplying multiple analog video signals are arranged. As the size and resolution of a display panel of such an apparatus are increased, the above-mentioned wideband amplifier is required to have an extremely high signal quality so that there is no phase differences between the multiple video signals and no dispersion in the amplitude characteristics and frequency characteristics.

(A4) In the drive circuit for a matrix type display apparatus, unlike the display in a CRT, analog video signals are sampled in accordance with a clock signal and displayed in pixels arranged in a matrix. At this time, since delays of signals in the drive circuit including delays in the bus lines in unavoidable, it is extremely difficult to accurately establish the sampling position for the analog video signals. Particularly, when displaying a computer graphic image in which the relationship between video signals and pixel addresses should be precisely defined, shift in the image display position, bleeding of the image, etc., due to signal delays in the drive system and deterioration of the frequency characteristics cause significant problems.

These problems which occur when using analog video signals are solved by using digital data as video signals. When the video signals are supplied in the form of digital data, a drive circuit shown in FIGS. 14 and 15 is used. For the sake of simplicity, the video signal data is composed of 2 bits ($D_0$, $D_1$). That is, video signal data have four values 0-3, and a signal voltage applied to each pixel is any one of four levels $V_0$-$V_3$. FIG. 14 is a circuit diagram showing a digital source driver circuit corresponding to the analog source driver circuit shown in FIG. 11. The circuit diagram of FIG. 14 shows the entire source driver for supplying driving voltages to N pixels. FIG. 15 shows a portion for the nth pixel in the circuit. The portion of the circuit comprises a D-type flip-flop (sampling flip-flop) $M_{SMP}$ at a first stage and a flip-flop (holding flip-flop) $M_H$ at a second stage which are provided for the respective bits ($D_0$, $D_1$) of the video signal data, a decoder DEC, and analog switches $ASW_0$ to $ASW_3$ each of which is provided between corresponding one of four external voltage sources $V_0$-$V_3$ and a source line $O_n$. For the sampling of digital video signal data, various circuits may be used other than the D-type flip-flop.

The digital source driver operates as follows. The video signal data ($D_0$, $D_1$) are sampled at the rising of a sampling pulse $T_{SMPn}$ corresponding to the nth pixel, by the sampling flip-flop $M_{SMP}$. At the time when the sampling for one horizontal period is completed, an output pulse OE is fed to the holding flip-flops $M_H$. All the video signal data ($D_0$, $D_1$) held in the holding flip-flops $M_H$ are simultaneously output to the respective decoders DEC. Each of the decoders DEC decodes the 2-bit video signal data ($D_0$, $D_1$). In accordance with the values (0 to 3), one of the analog switches $ASW_0$-$ASW_3$ is conductive, and the corresponding one of the four external voltages $V_0$-$V_3$ is output to the source line $O_n$.

The source drive in which digital video signals are used for sampling can solve the problems (A1) to (A4) which arise when analog video signals are used for sampling. However, this source driver still has the following problems (D1) and (D2) to be solved.

(D1) With the increase in number of bits of digital video signal data, the size of each of memory cells, decoders, etc., constituting a drive circuit is drastically enlarged. Therefore, the size of a chip and the production cost are greatly increased.

(D2) When voltage sources supplied externally ($V_0$-$V_3$ in FIGS. 14 and 15) are selected by using analog switches, the selected voltage source is directly connected to a source line of the liquid crystal panel and drives the source line. Accordingly, the circuit is required to have a performance capable of sufficiently driving the heavy load, i.e. the liquid crystal panel. This causes the production cost to increase.

SUMMARY OF THE INVENTION

The drive circuit of this invention, which overcomes the above-discussed and numerous other disadvantages and deficiencies of the prior art, comprises: voltage supplying means for supplying a plurality of signal voltages, the levels of said signal voltages being different; voltage selecting means, connected to said voltage supplying means, for receiving said digital video signal, for selecting one of said signal voltages in accordance with said digital video signal, and for supplying said selected signal voltage; signal voltage means, provided for each of said signal electrodes, for receiving said signal voltage from said voltage selecting means and for supplying said signal voltage to one of said signal electrodes via a corresponding switching element; and selection signal generating means for generating selection signals by which said switching elements are sequentially conductive, said selection signal generating means being connected to the control terminals of said switching elements of all said signal voltage means.

In preferred embodiments, said drive circuit comprises a predetermined number of said voltage selecting means, and each of said voltage selecting means is connected to said signal voltage means corresponding to signal electrodes at every said predetermined number, and said selection signal generating means generates selection signals by which said switching elements are conductive for a period which continues said predetermined number of times as long as the duration of said digital video signal.

Preferably, said signal holding capacitor is connected between said signal input switching element and said signal output switching element.

By a selection signal generated by the selection signal generating means, one or a plurality of signal voltage means are sequentially selected. The selected signal voltage means send out a signal voltage supplied from the voltage selecting means connected to the selected signal voltage means, to a signal electrode. Thus, at a certain point of time, the voltage supplying means connected to the voltage selecting means is not connected to all the signal electrodes, but only one or a plurality of selected signal electrodes.

The invention is accomplished in view of the above-mentioned present state. The objective of the invention is to provide a drive circuit for a display apparatus for digital video signal data in order to solve the disadvantages (A1) to (A4) in analog sampling, and moreover, to eliminate the problems (D1) and (D2).

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
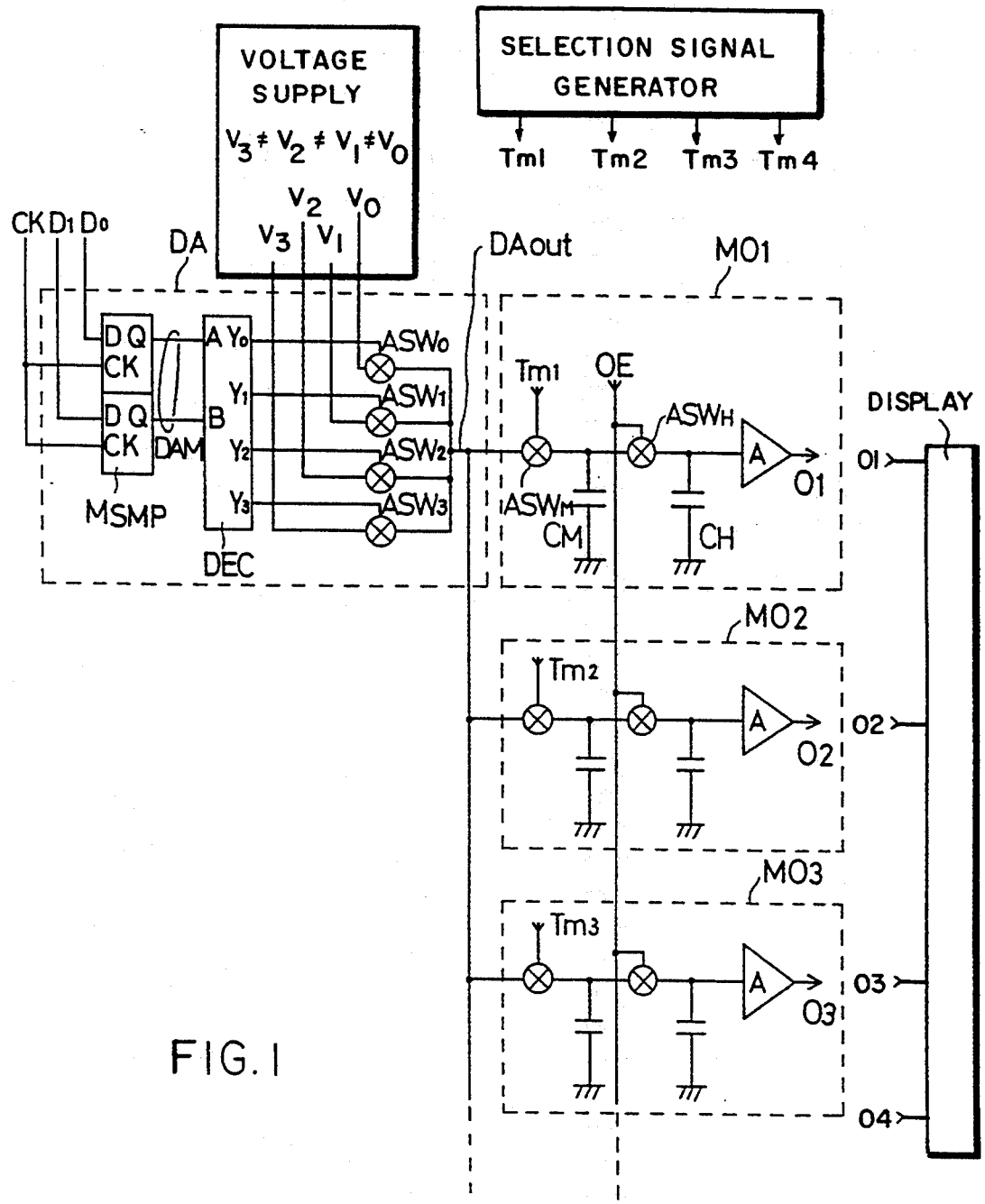
FIG. 1 is a circuit diagram showing a signal voltage supplying circuit for an LCD apparatus in one embodiment of the invention.

FIG. 1 shows a signal voltage output circuit (a source driver) for supplying signal voltages to N signal lines (source lines) in a drive circuit for a matrix type LCD apparatus in one embodiment of the invention. In this embodiment, for the sake of simplicity, 2-bit video signal data are used. The signal voltage output circuit of FIG. 1 comprises a digital-analog (D/A) conversion circuit DA for selecting one of plural external voltages in accordance with digital video signal data, and signal voltage hold circuits $MO_i$ (I is 1 to N) provided for the respective N pixels on one scanning line. In the D/A conversion circuit DA, the 2-bit video signal data of $D_0$ and $D_1$ is sampled by a sampling flip-flop $M_{SMP}$ and input into a decoder DEC. The sampling flip-flop $M_{SMP}$ includes two D-type flip-flops corresponding to the respective bit of the input data. In accordance with the video signal data ($D_0$, $D_1$) input into the decoder DEC through input terminals A and B thereof, the decoder DEC outputs an ON-control signal to one of analog switches $ASW_0$–$ASW_3$ through corresponding one of four output terminals $Y_0$–$Y_3$. External voltage sources (from an external voltage supply) $V_0$–$V_3$ are connected to terminals of the analog switches $ASW_0$–$ASW_3$, respectively. The other terminals of the analog switches are connected to a first analog switch ASWM in the input portion of each of the signal voltage hold circuits $MO_i$ (i is 1 to N).

The configuration of the signal voltage hold circuit $MO_1$ for the first source line be described. The other terminal of the first analog switch ASWM is connected to one terminal of a second analog switch ASWH. A capacitor $C_M$ is connected between the other terminal of the first analog switch ASWM and the ground. The other terminal of the second analog switch ASWH is connected to an input terminal of a buffer amplifier A. A capacitor $C_H$ is connected between the other terminal of the second analog switch ASWH and the ground. A selection pulse $Tm_1$ is fed into the control terminal of the first analog switch ASWM. An output pulse OE is fed into the control terminal of the second analog switch ASWH. Each of the signal voltage held circuits $MO_i$ corresponding to the other source lines has the same configuration as that of the signal voltage held circuit $MO_i$. The selection pulses $TM_i$ are sequentially supplied from a selection signal generator to the respective signal voltage hold circuits $MO_i$, and the output pulse OE is supplied in common to all the signal voltage hold circuits $MO_i$ at the same time.

Figure 2:
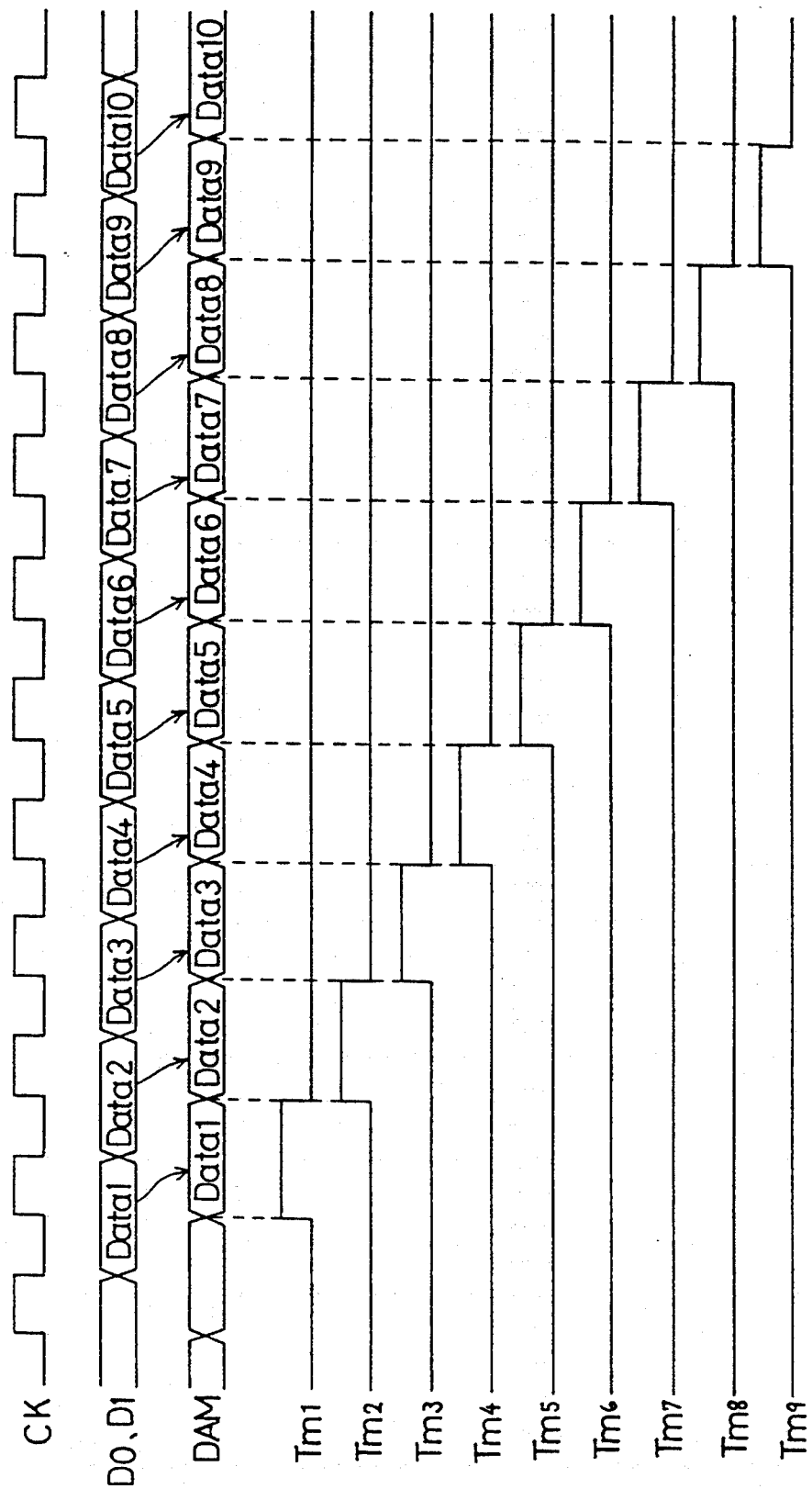
FIG. 2 is a timing chart illustrating the operation of the signal voltage supplying circuit of the embodiment.

The operation of the signal voltage output circuit shown in FIG. 1 will be described with reference to the timing chart of FIG. 2. The 2-bit digital video signal data ($D_0$, $D_1$) is fed in synchronization with the falling edge of a clock pulse CK. The sampling flip-flop $M_{SMP}$ of the D/A conversion circuit DA shown in FIG. 1 latches digital video signal data $Data_1$, $Data_2$, $Data_3$, . . . corresponding to the respective pixels at the rising of the clock pulse CK, and outputs them to the decoder DEC as data DAM. The decoder DEC which receives the data $Data_i$ makes one of the outputs of the output terminals $Y_0$–$Y_3$ effective, and the corresponding one of analog switches $ASW_0$–$ASW_3$ is conductive. For example, if the contents of the data $Data_1$ is ($D_0$, $D_1$)=(1, 1), the analog switch $ASW_3$ is conductive, and the external voltage $V_3$ is selected to be output as the output $DA_{out}$ of the D/A conversion circuit DA.

The outputs $DA_{out}$ of the D/A conversion circuit DA are supplied to all of the signal voltage hold circuits $MO_i$. However, at the time when the data $Data_1$ is sampled, only the analog switch ASWM in the signal voltage hold circuit $MO_1$ for the 1st source line $O_1$ is conductive in accordance with the selection pulse $Tm_1$. As a result, the external voltage $V_3$ is applied only to the capacitor $C_M$ in the signal voltage hold circuit $MO_1$.

At the next rising of the clock pulse CK, the next digital data $Data_2$ is sampled, and the value thereof is decoded by the decoder DEC. An external voltage corresponding to the decoded data is supplied to all of the signal voltage hold circuits $MO_i$ as the output $DA_{out}$ of the D/A conversion circuit DA. At this time, only the analog switch ASWM in the signal voltage hold circuit $MO_2$ for the 2nd source line $O_2$ is conductive in accordance with the selection pulse $Tm_2$, so that the output $DA_{out}$ is applied to the capacitor $C_M$ in the signal voltage hold circuit $MO_2$. That is, every time when the digital video signal data $Data_i$ is sampled, the external voltage $V_x$ is applied only to the capacitor $C_M$ in the ith signal voltage hold circuit $MO_i$ in accordance with the selection pulse $Tm_i$.

After N digital video signal data $Data_1$–$Data_N$ in one horizontal period are sampled and the capacitor $C_M$ in the Nth signal voltage hold circuit $MO_N$ is charged, the output pulse OE is fed to the second analog switches ASWH in all of the signal voltage hold circuits $MO_1$–$MO_N$. Therefore, the data held in the capacitors $C_M$ are transferred to the capacitors $C_H$ at the same time, and output to the respective source lines $O_1$–$O_N$ via the buffer amplifiers A. Thus, the pixels in the LCD apparatus are charged by the respective signal voltages.

Figure 14:
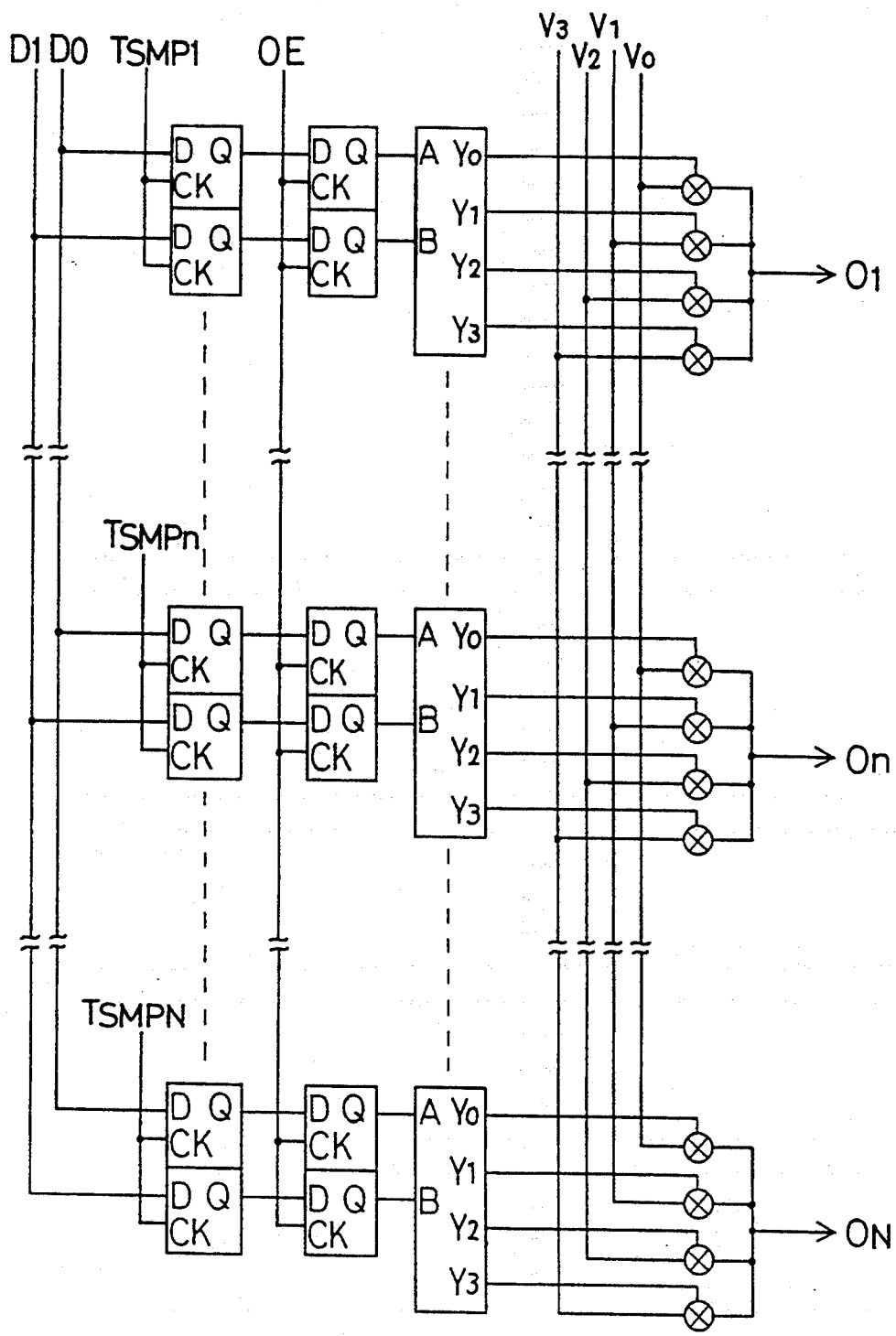
FIG. 14 is a circuit diagram showing a drive circuit in which digital sampling circuits are provided for every source line.
Figure 15:
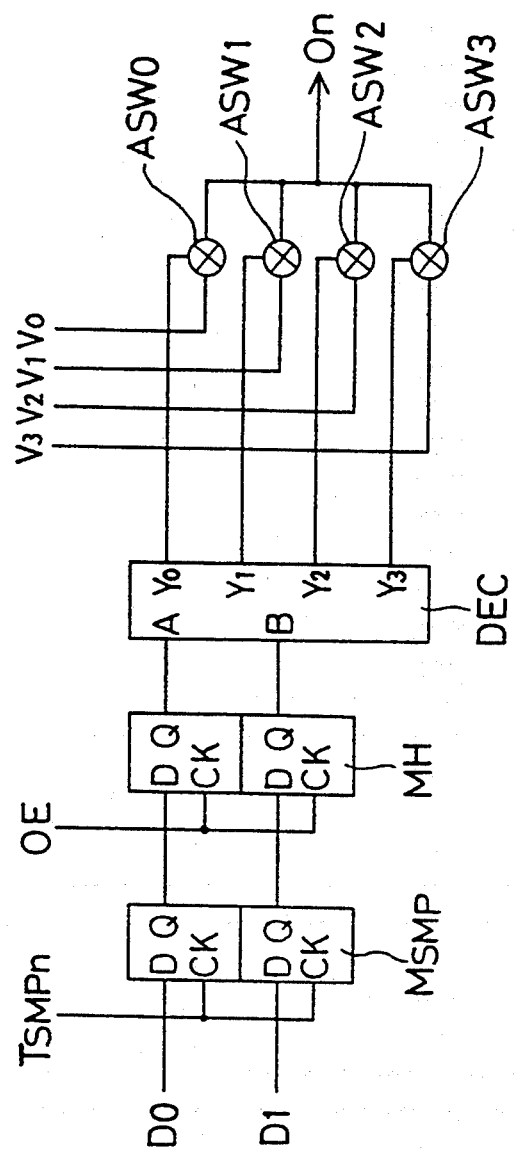
FIG. 15 is a circuit diagram showing a portion for one source line in the circuit of FIG. 14.
Figure 16A:
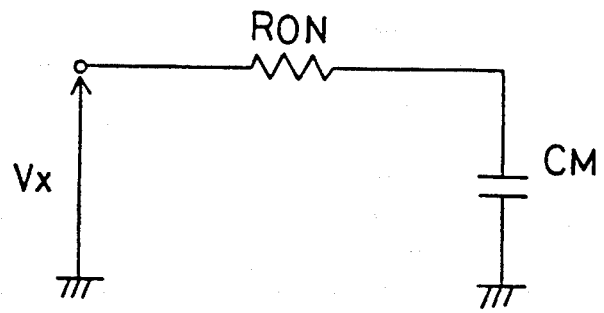
FIG. 16 shows in (a) an equivalent circuit diagram when the signal voltage is supplied in the first embodiment of the invention and in (b) an equivalent circuit diagram when the signal voltage is supplied in the circuit of FIG. 14.
Figure 16B:
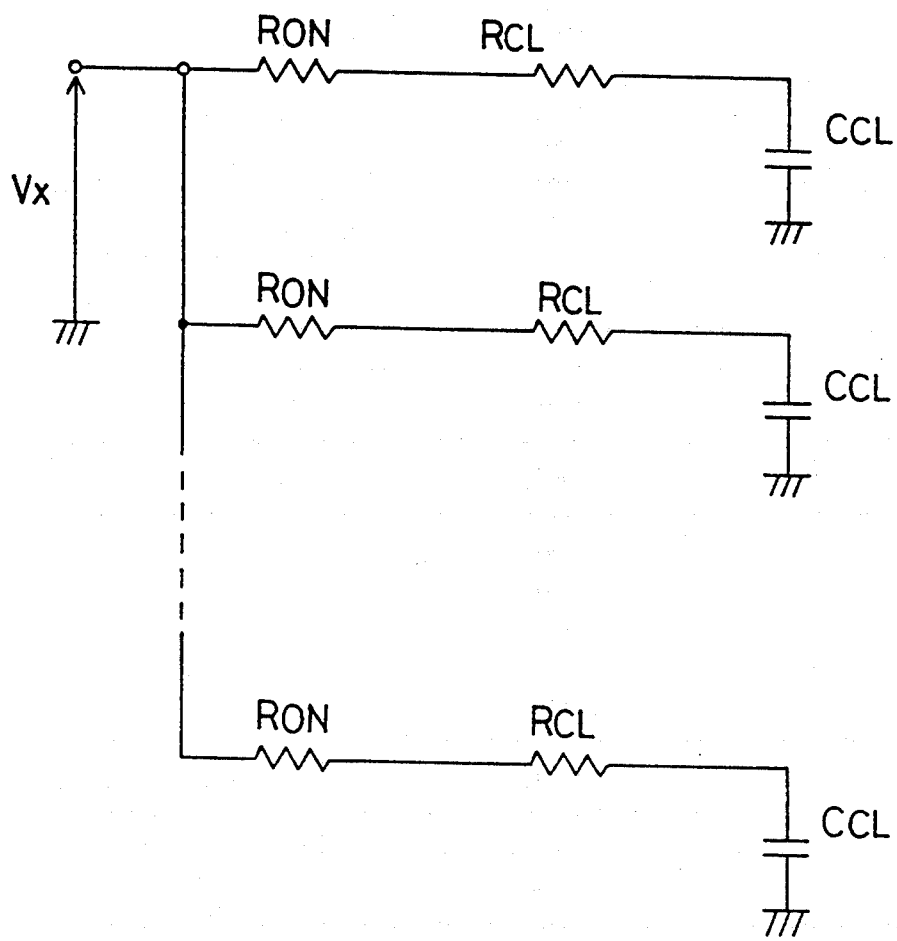

As described above, in the signal voltage output circuit of the embodiment shown in FIG. 1, the external voltage source $V_x$ is connected only to the capacitor $C_M$ in one signal voltage hold circuit $MO_i$ selected by the selection pulse $Tm_i$. The equivalent circuit at this time is shown in (a) of FIG. 16, and the loads of the external voltage $V_x$ are the on-resistance $R_{ON}$ of the selected one analog switch ASWM and the capacitance of the capacitor $C_M$. However, the on-resistance $R_{ON}$ of the analog switch ASWM is small and the capacitance of the capacitor $C_M$ can be made as small as about 7 pF, so that the load of the external voltage source is small. By contrast, for example, in the drive circuit shown in FIG. 14, the external voltage $V_x$ directly drives the pixels of the liquid crystal panel. Therefore, as shown in (b) of FIG. 16, the resistance $R_{CL}$ and the capacitance $C_{CL}$ of the line to the pixel and the pixel itself also are connected to the on-resistance $R_{ON}$ of the analog switch ASWM. Specifically, the values of the resistance $R_{CL}$ and the capacitance $C_{CL}$ have a large value such as approximately 50 kΩ and 200 pF, respectively. Moreover, in the circuit of FIG. 14, the selected external voltage source $V_x$ is connected to a large number of pixels among the N pixels on one scanning line (the maximum number is N). As described above, since the loads of the external voltage sources $V_0$–$V_3$ are very large in the drive circuit of FIG. 14, it is necessary to prepare voltage sources having a large capacity. By contrast, in the embodiment of FIG. 1, since the external voltage sources $V_0$–$V_3$ are respectively used only for applying a voltage to one capacitor $C_M$, the power source device is a very simple one, irrespective of the number of source lines.

Figure 3:
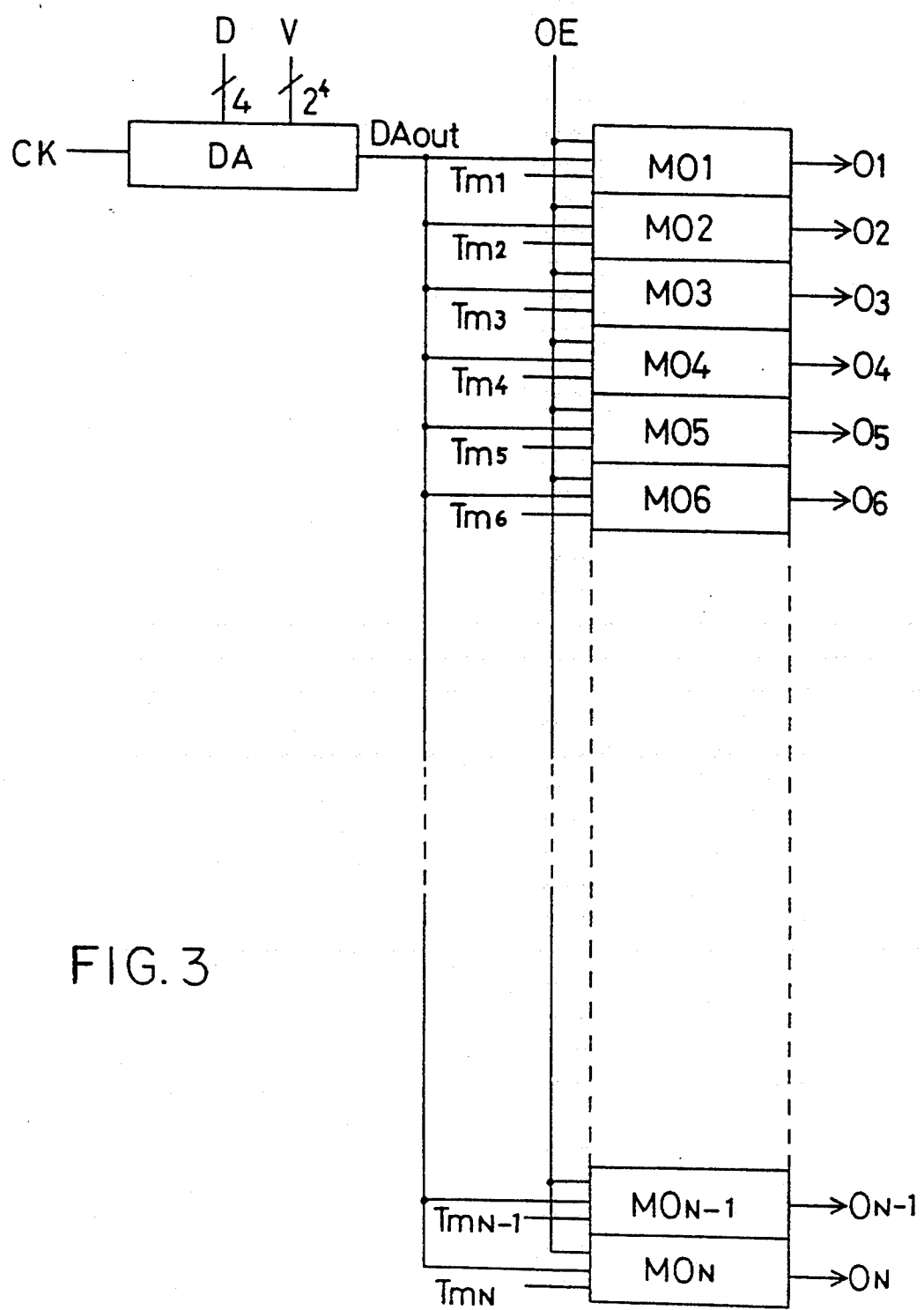
FIG. 3 is a block diagram showing the circuit of FIG. 1 in a simplified manner.

FIG. 3 is a block diagram showing in a simplified manner the signal voltage output circuit in the embodiment of FIG. 1. The signal voltage output circuit in this embodiment is provided with one D/A conversion circuit DA. The output $DA_{out}$ is connected to all of the N signal voltage hold circuits $MO_1$–$MO_N$. Actually, the signal voltage is sent out only to one signal voltage hold circuit $MO_i$ selected by a selection pulse $Tm_i$.

Figure 4:
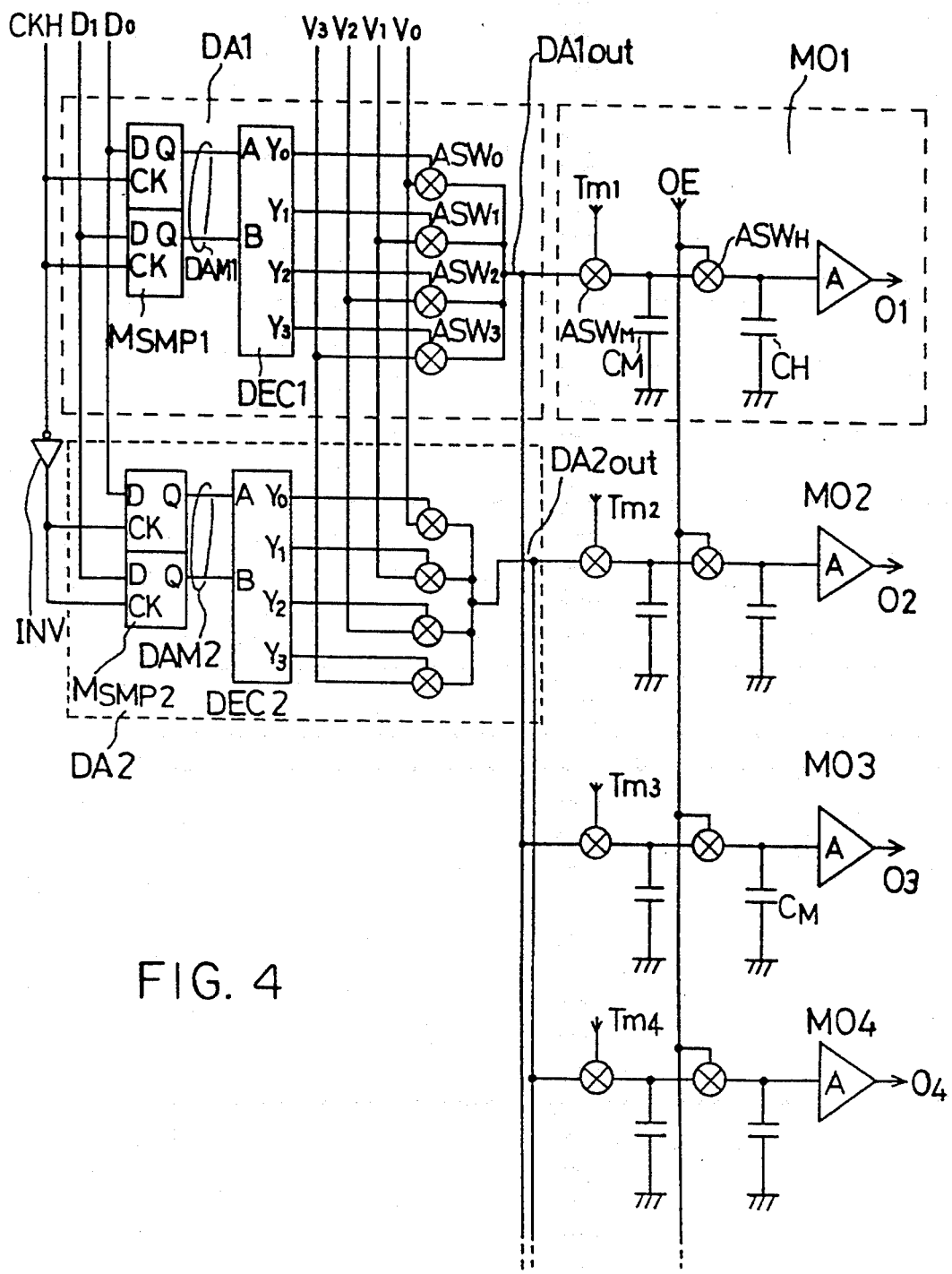
FIG. 4 is a circuit diagram showing a signal voltage supplying circuit with two D/A conversion circuits in a second embodiment of the invention.

A second embodiment of the invention is shown in FIG. 4. The second embodiment comprises a signal voltage output circuit which is provided with two D/A conversion circuits DA1 and DA2. In the embodiment, one half of the N source lines $O_1$–$O_N$ (i.e., (N/2) source lines) is assigned to each of the D/A conversion circuits DA1 and DA2. The two D/A conversion circuits DA1 and DA2 receive digital video signal data, and output one of external voltages $V_0$–$V_3$ as outputs $DA_{1out}$ and $DA_{2out}$ in accordance with the values of the received data, respectively. The first D/A conversion circuit DA1 is connected to the signal voltage hold circuits $MO_{2k-1}$ for odd source lines $O_{2k-1}$ such as the 1st and 3rd source lines. The second D/A conversion circuit DA2 is connected to the signal voltage hold circuits $MO_{2k}$ for even source lines $O_{2k}$ such as the 2nd and 4th source lines. In this embodiment, the clock pulse CK is not used as it is, but a pulse CKH the frequency of which is divided in half as compared with the clock pulse CK is used as a sampling pulse in a sampling flip-flop $M_{SMP}$ in the first D/A conversion circuit DA1. In a sampling flip-flop $M_{SMP}$ in the second D/A conversion circuit DA2, the inverted pulse of the pulse CKH through an inverter INV is used as a sampling pulse.

Figure 5:
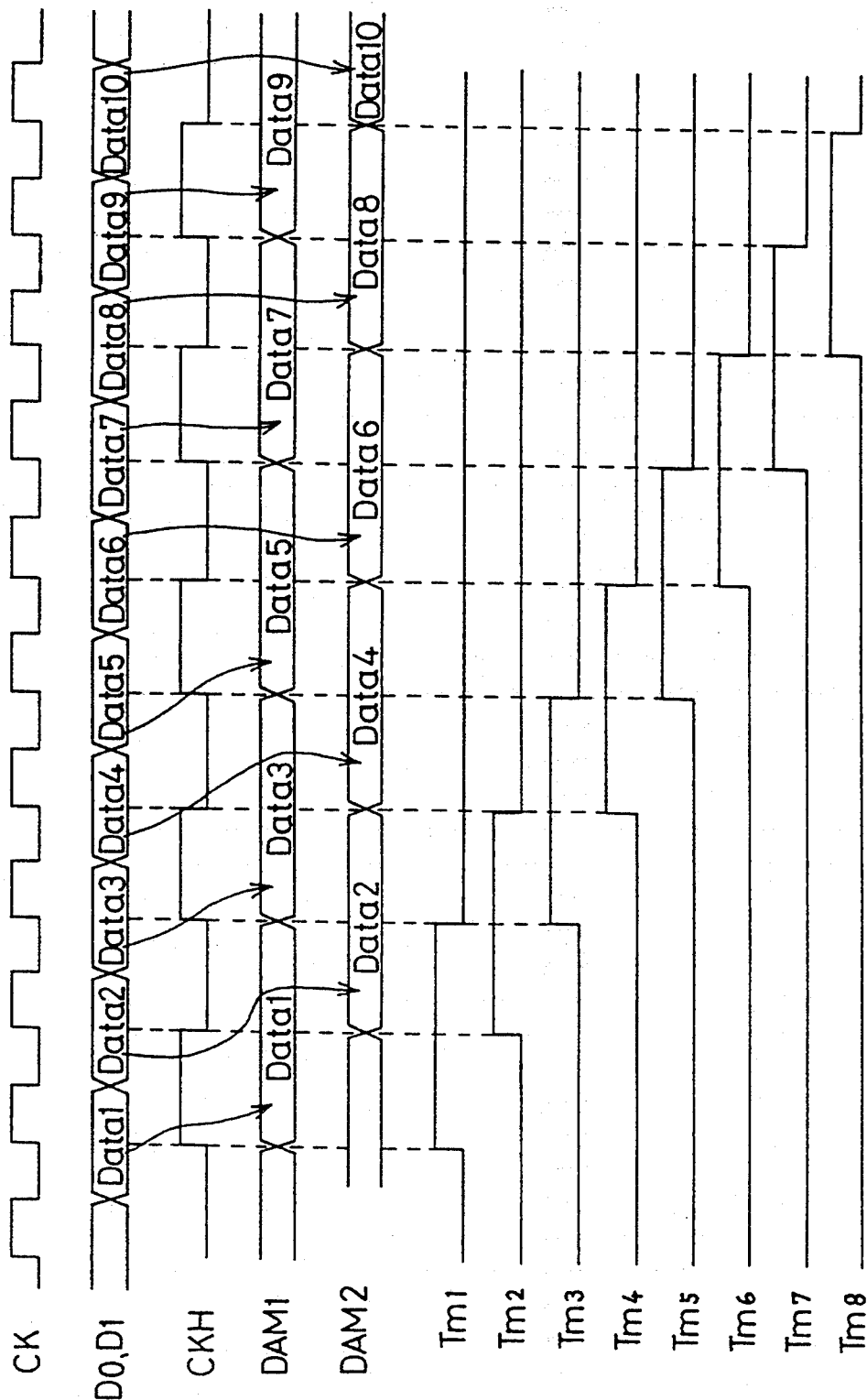
FIG. 5 is a timing chart illustrating the operation of the signal voltage supplying circuit of the second embodiment.

The operation of the circuit is described with reference to the signal timing chart of FIG. 5. The digital video signal data ($D_0$, $D_1$) is sampled by the sampling flip-flop $M_{SMP}$ of the first D/A conversion circuit DA1 at every rising of the clock pulse CKH, and sampled by the sampling flip-flop $M_{SMP}$ of the second D/A conversion circuit DA2 at every falling of the clock pulse CKH. Thus, the first sampling flip-flop $M_{SMP1}$ samples data of odd numbers such as the first data $Data_1$ and the third data $Data_3$. The second sampling flip-flop $M_{SMP2}$ samples data of even numbers such as the second data $Data_2$ and the fourth data $Data_4$. The sampling flip-flops sample at every period of the clock pulse CKH, so that the data are held in the sampling flip-flops $M_{SMP1}$ and $M_{SMP2}$ for two periods of the clock pulse CK. The outputs $DAM_1$ and $DAM_2$ of the sampling flip-flops $M_{SMP1}$ and $M_{SMP2}$ are supplied to decoders $DEC_1$ and $DEC_2$, respectively. Each of the decoders $DEC_1$ and $DEC_2$ selects one of the external voltages $V_0$–$V_3$ in accordance with the same logic as in the decoder DEC shown in FIG. 1. The external voltages selected by the decoders $DEC_1$ and $DEC_2$ are output to the odd and even signal voltage hold circuits $MO_i$ as outputs $DA_{1out}$ and $DA_{2out}$, respectively. In the signal voltage hold circuits $MO_1$–$MO_n$, these signals are blocked by the first analog switches ASWM, but in the signal voltage hold circuit $MO_i$ which is sequentially selected by the pulse $Tm_i$, the signal voltage $DA_{1out}$ or $DA_{2out}$ is applied to the capacitor $C_M$. At this time, the duration of the selection pulse $Tm_i$ is equal to two periods of the clock pulse, so that the signal voltage $DA_{1out}$ or $DA_{2out}$ is applied to the capacitor $C_M$ for a time period twice as long as in the embodiment of FIG. 1. Thus, when all of the capacitors $C_M$ of the N signal voltage hold circuits $MO_1$–$MO_N$ hold the signal voltages, the output pulse OE is supplied to all of the signal voltage hold circuits $MO_1$–$MO_N$, so that the signal voltages are output to the source lines $O_1$–$O_N$ to be applied to the pixels.

As described above, in the embodiment of FIG. 4, the signal voltage $DA_{1out}$ or $DA_{2out}$ generated by the selected external voltage can be applied to the capacitor $C_M$ for the period of time twice as long as the duration of the digital video signal data (i.e., the period of the clock pulse). In other words, even if the duration of the digital video signal data is shortened, it is possible to take sufficient time for charging the capacitor $C_M$ in the circuit of this embodiment.

Figure 6:
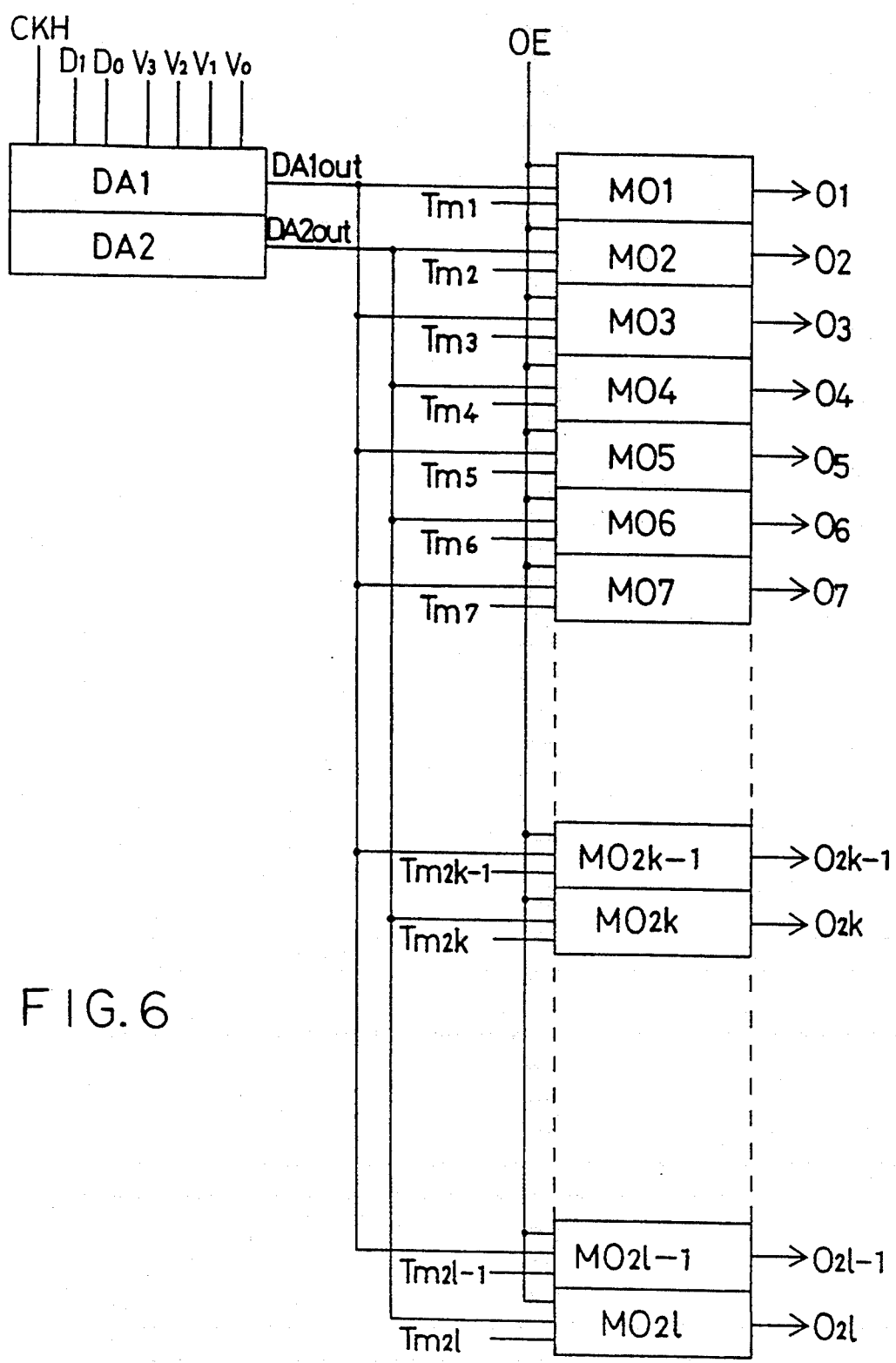
FIG. 6 is a block diagram showing the circuit of the second embodiment in a simplified manner.
Figure 7:
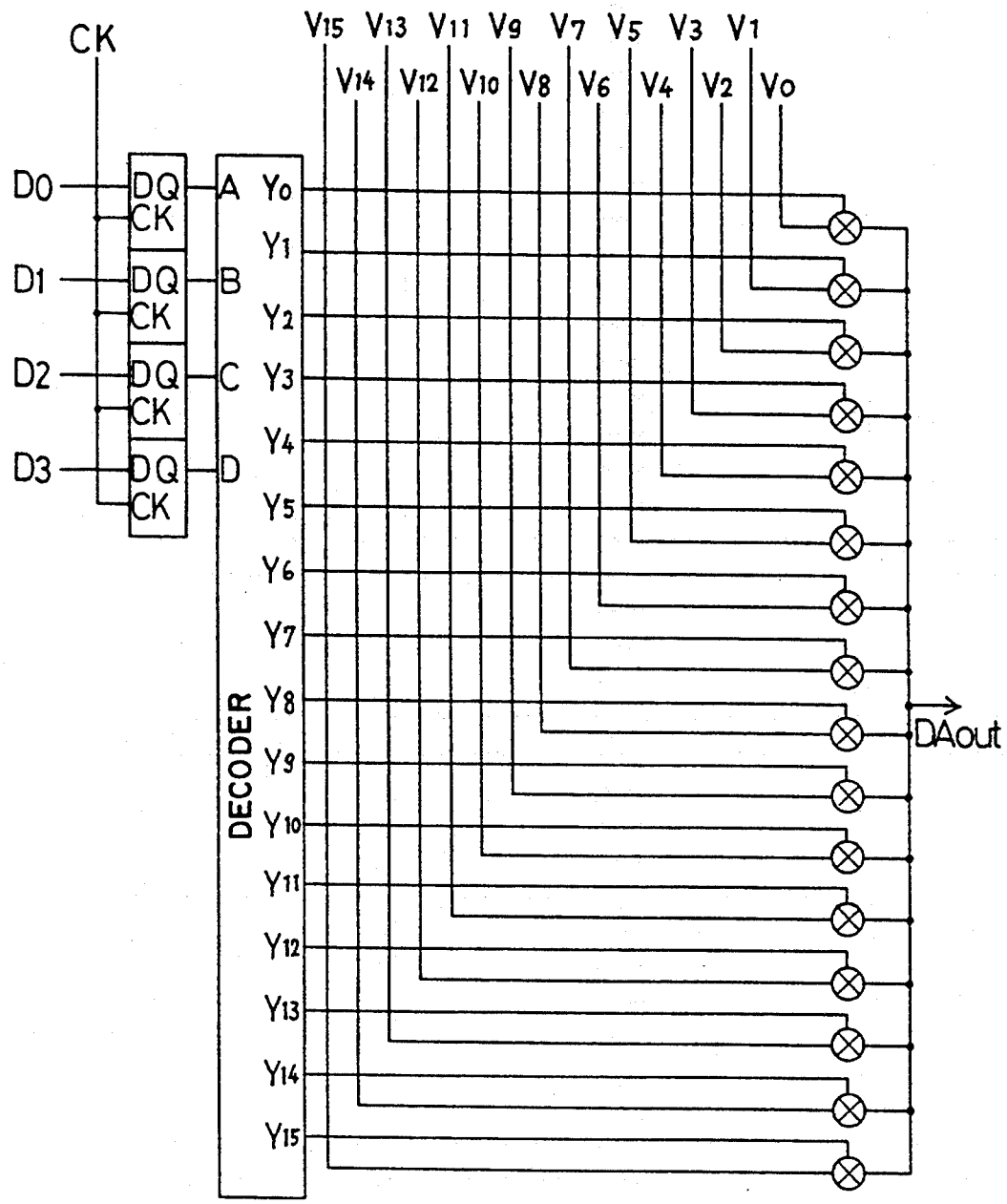
FIG. 7 is a circuit diagram showing a portion of a D/A conversion circuit for 4-bit digital video signal data in a third embodiment of the invention.
Figure 8:
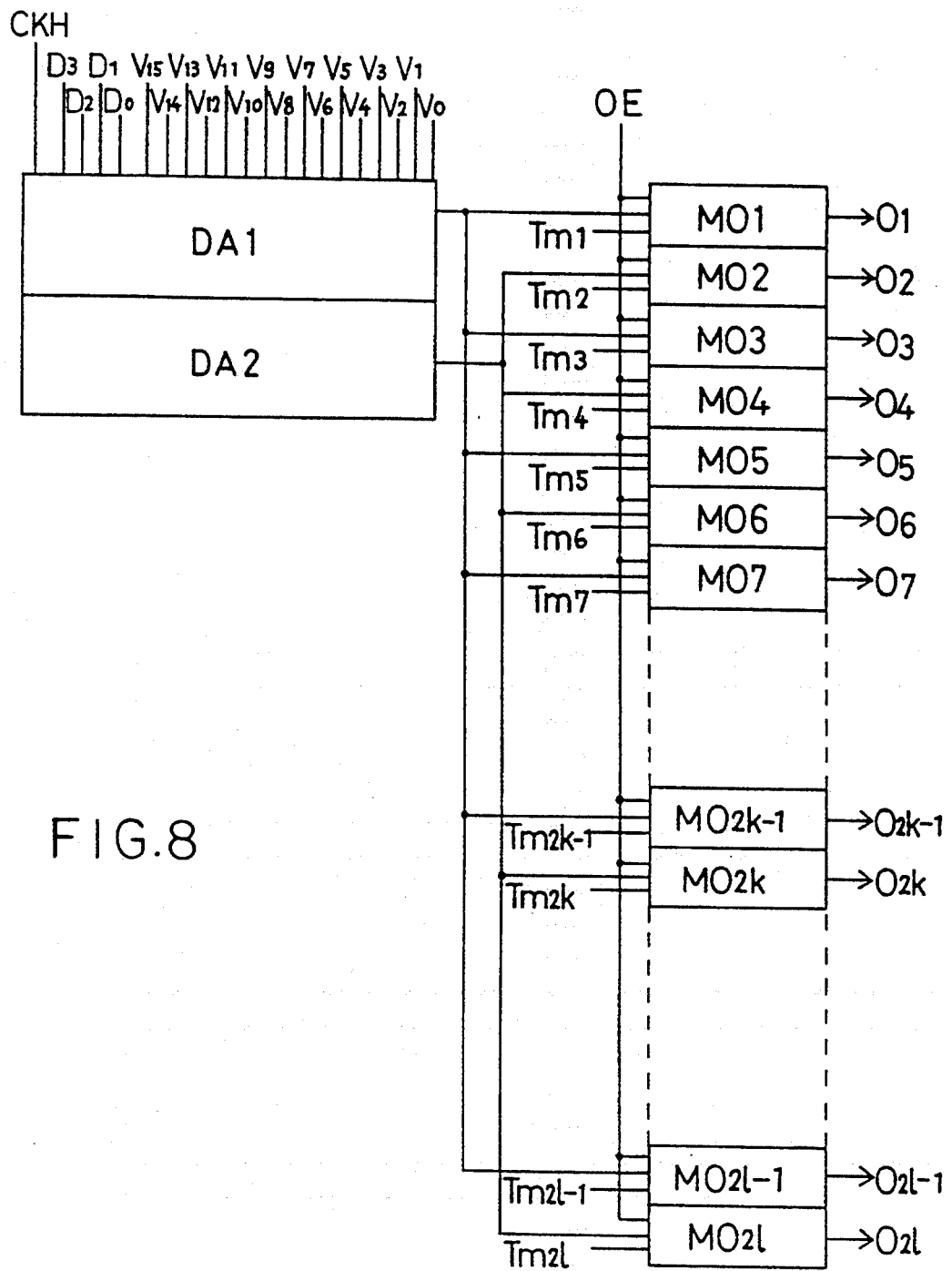
FIG. 8 is a block diagram showing the circuit of the third embodiment in a simplified manner.
Figure 9:
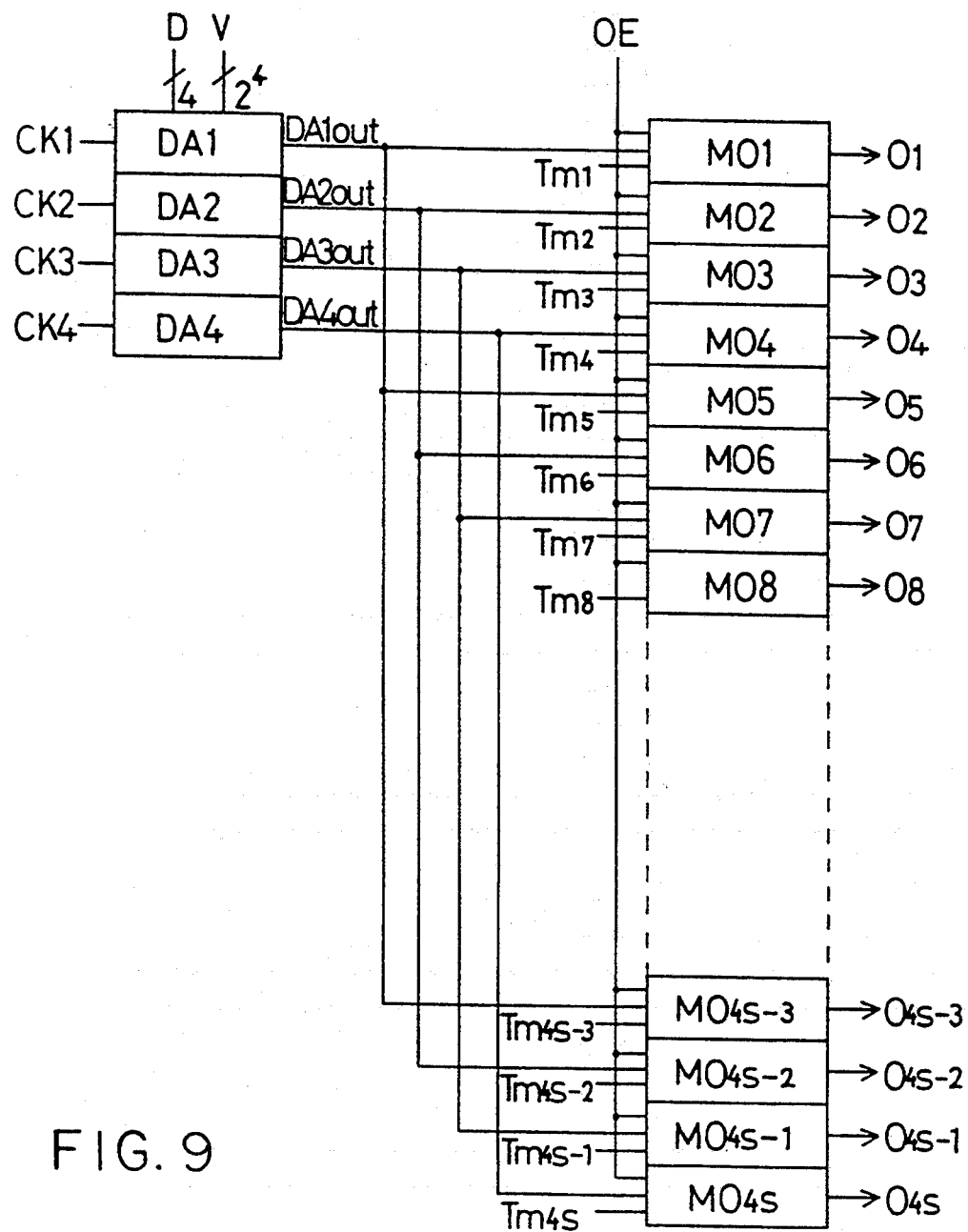
FIG. 9 is a block diagram of a signal voltage supplying circuit with four D/A conversion circuits for 4-bit data in a fourth embodiment of the invention.
Figure 10:
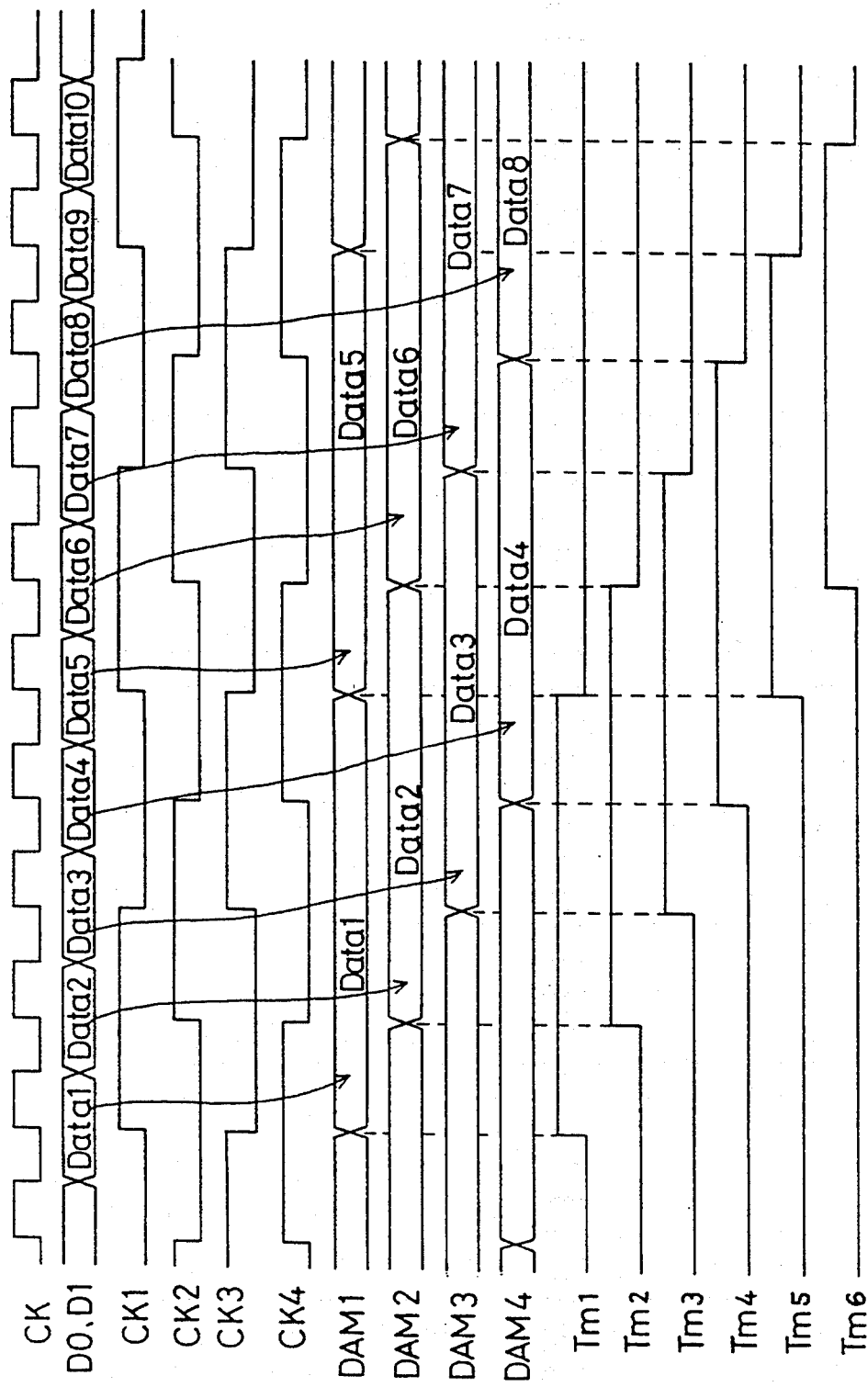
FIG. 10 is a timing chart illustrating the operation of the signal voltage supplying circuit in the fourth embodiment.
Figure 11:
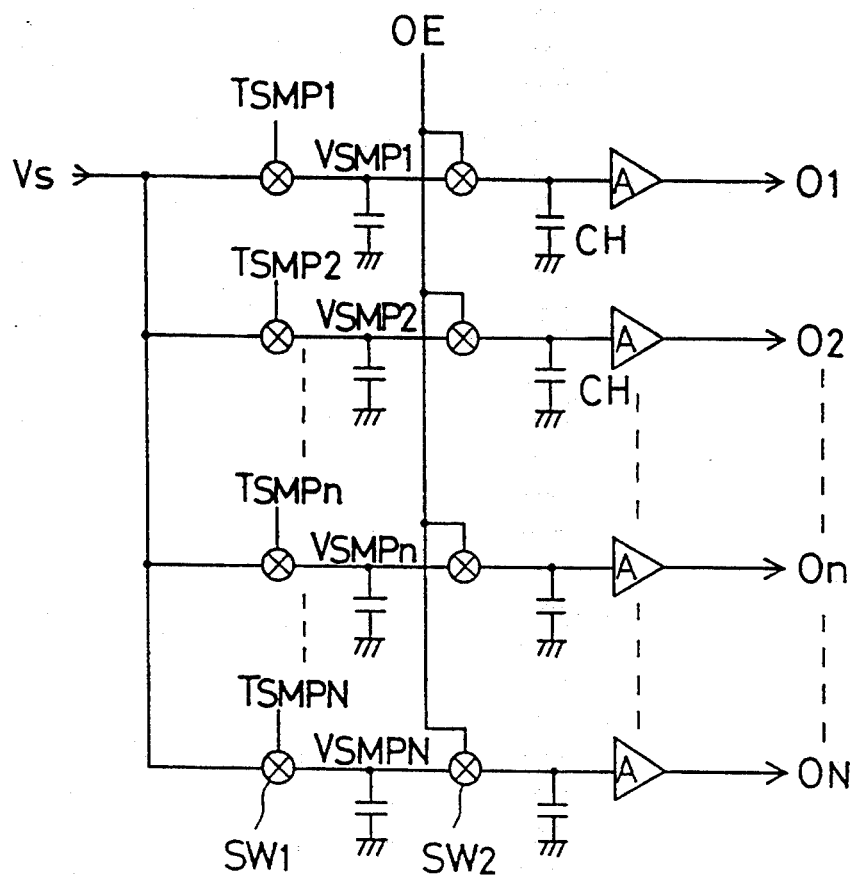
FIG. 11 is a circuit diagram showing a drive circuit for analog video signals.
Figure 12:
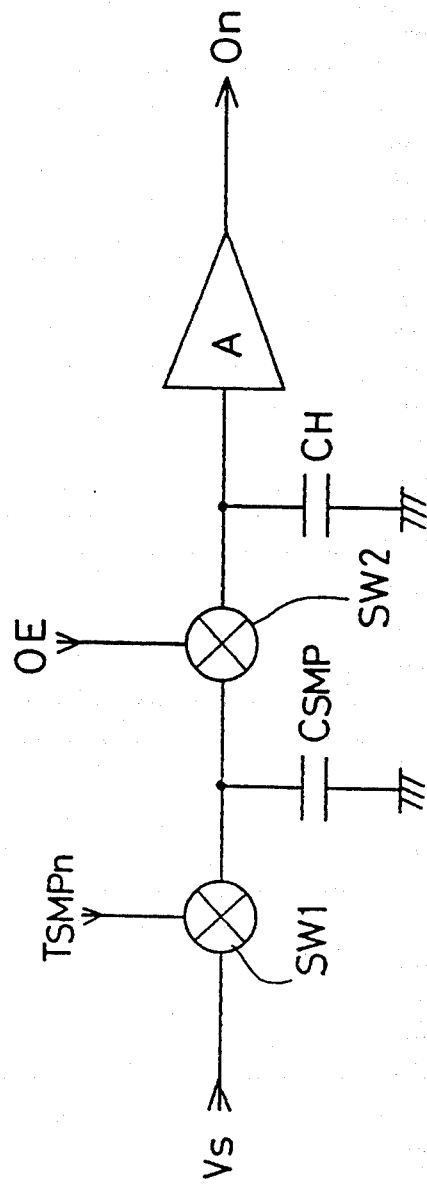
FIG. 12 is a circuit diagram showing a portion for one source line in the circuit of FIG. 11.
Figure 13:
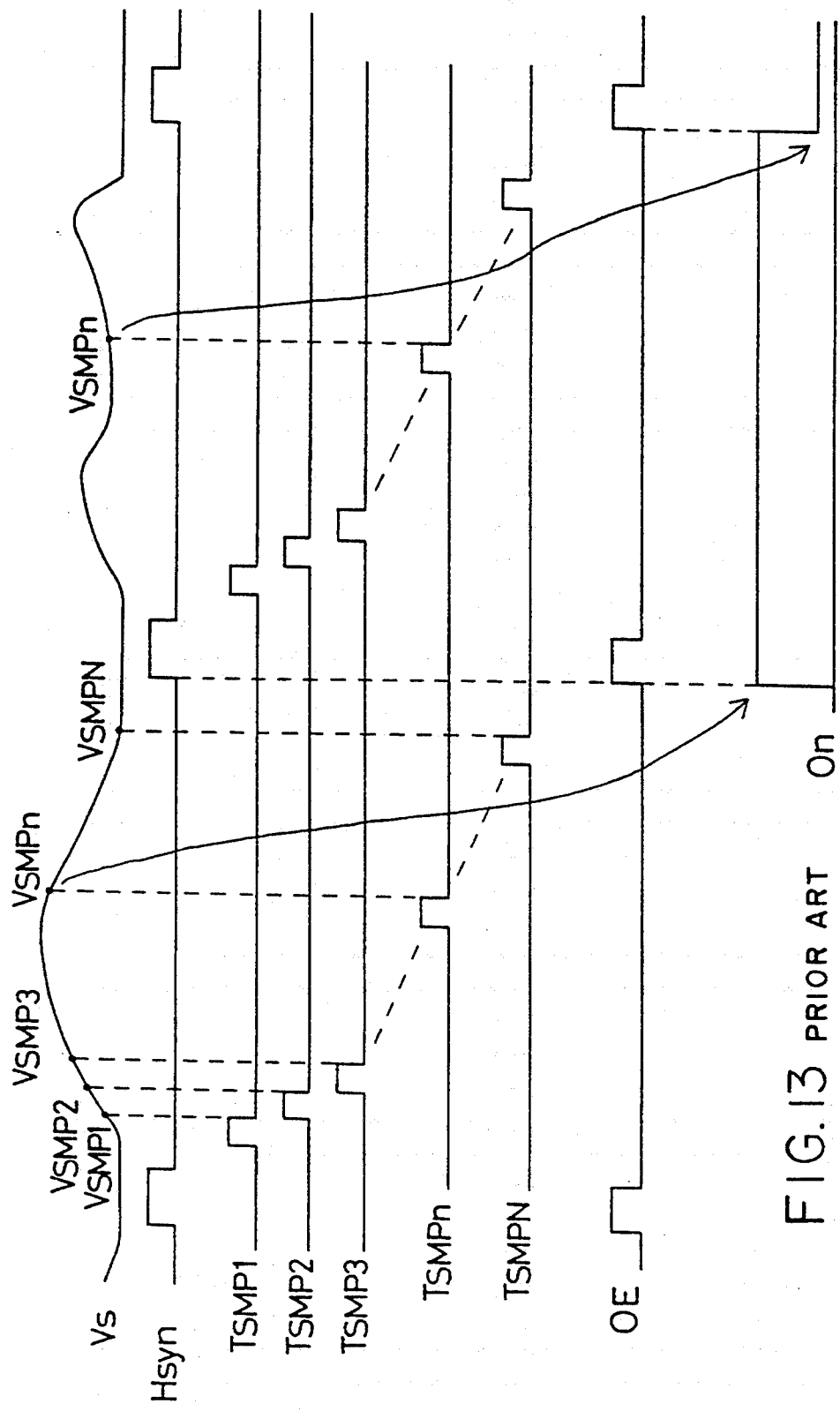
FIG. 13 is a timing chart illustrating the operation of the drive circuit of FIG. 11.

In the circuits shown in FIGS. 1 and 4, the digital video signal is a 2-bit data. Next, the configuration of a D/A conversion circuit to which the digital video data of 4 bits is supplied is shown in FIG. 7. In this case, according to the number of bits of the data, a sampling flip-flop $M_{SMP}$ comprises four flip-flops, and the required levels of external voltage is $2^4 = 16$ ($V_0$–$V_{15}$). This may cause the decoder DEC to become large (4 inputs, and 16 outputs). However, after one of the external voltages $V_x$ selected by analog switches ASW-0–ASW15 is output as an output $DA_{out}$, the circuit operates in the same manner as in the circuit of FIG. 1. Furthermore, the block configuration of a signal voltage output circuit with two D/A conversion circuits DA1 and DA2 to which digital video signal data of 4 bits is supplied is shown in FIG. 8. The configuration is the same as that of the circuit shown in FIG. 6, except that the number of external voltage levels is 16 ($V_0$–$V_{15}$). Accordingly, the circuit is suitable as a drive circuit for a liquid crystal panel which has numerous pixels and numerous gray-scale levels. The block configuration of a signal voltage output circuit having four D/A conversion circuits DA1–DA4 is shown in FIG. 9, and the signal timing chart is shown in FIG. 10. In this case, pulses CK1–CK4 the frequency of each of which is divided into four with respect to the block pulse CK are used. The pulses CK1–CK4 are shifted by one clock period. Each of the four D/A conversion circuits DA1–DA4 samples digital video signal data every four data. In other words, the first D/A conversion circuit DA1 samples the (4k-3)th data such as the 1st data $Data_1$ and the 5th data $Data_5$. The second D/A conversion circuit DA2 samples the (4k-2)th data such as the 2nd data $Data_2$ and the 6th data $Data_6$. The third D/A conversion circuit DA3 samples the (4k-1)th data such as the 3rd data $Data_3$ and the 7th data $Data_7$. The fourth D/A conversion circuit DA4 samples the 4kth data such as the 4th data $Data_4$ and the 8th data $Data_8$. The sampled data are held in the sampling flip-flops for the four periods of clock pulse. Since the duration of the selection pulse $Tm_i$ equals to four periods of the clock pulse, the outputs $DA_{1out}$–$DA_{4out}$ of the D/A conversion circuits DA1–DA4 are respectively applied to the capacitors $C_M$ for a time period four times as long as the duration of the digital data. Therefore, the drive circuit is extremely advantageous, when the number of pixels is increased and the duration of the input signal is shortened.

According to the invention, digital video signal data are first converted into analog voltage signals, and then the signal voltages are sequentially output to respective capacitors for holding signal electrodes in accordance with selection pulses, in the same manner as in the prior art analog drive circuit. Therefore, since the external voltage source is connected only to the selected pixels, the loads for the external voltage source can be made very small. Accordingly, even when the number of pixels is increased with the increase in size and the improvement in resolution of the display apparatus, the capacity of the external voltage sources can still be extremely small. Furthermore, in the drive circuit of the invention, since a digital sampling circuit is not provided for each source line, the numbers of flip-flops, decoders and the like are still small, even if the number of pixels is increased. Moreover, even if the number of bits of the digital video signal data is increased, the number of flip-flops, decoders and the like which become larger in size is small. Therefore, if the size is increased and the resolution is improved in the display apparatus, the chip size can be prevented from being drastically enlarged.

Furthermore, by providing a plurality of circuits for converting digital video signal data into analog voltages, the external voltage can be supplied to the capacitor of each signal voltage hold circuit for a longer time period than the duration of the digital video signal data. Therefore, the drive circuit of the invention can be sufficiently used in a display apparatus with high resolution in which the duration of the video signal is short.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A drive circuit for a display, comprising:
   a plurality N of signal lines for coupling video data to said display;
   voltage supplying means for supplying a plurality of signal voltages, the levels of said signal voltages being different;
   a plurality M of voltage selecting means connected to said voltage supplying means, each of said voltage selecting means for receiving a digital video signal and for providing as an output one of said plurality of signal voltages based on said received digital video signal;
   a signal voltage hold circuit for each of said plurality of signal lines, each of said signal voltage hold circuits comprising a signal voltage output coupled to a respective signal line, and a signal voltage input for receiving the output from a corresponding one of said plurality of voltage selecting means, said signal voltage hold circuit being capable of controllably providing said output received from said corresponding one of said plurality of voltage selecting means to said signal line by way of said signal voltage output; and
   wherein the value of M is less than th value of N/2, and at least two of said signal voltage hold circuits are connected to the same corresponding voltage selecting means.

2. The drive circuit of claim 1, wherein each of said outputs of said voltage selecting means is coupled to the signal voltage inputs of corresponding signal voltage hold circuits, the number of said corresponding signal voltage hold circuits being equal to N divided by M.

3. The drive circuit of claim 2, wherein said digital video signal is fed to said plurality M of voltage selecting means including a flip flop circuit in synchronization with an original clock pulse and each of said voltage selecting means samples and latches said digital video signal in synchronization with a sampling clock pulse having a frequency equal to 1M times the frequency of the original clock pulse.

4. The drive circuit of claim 1, wherein said signal voltage hold circuits are sequentially ordered, and every Mth signal hold circuit in said sequence receives as said signal voltage input the output of a corresponding Mth one of said voltage selecting means.

5. The drive circuit of claim 1, wherein M is substantially less than N/2.

6. The drive circuit of claim 1, wherein each of said signal voltage hold circuits comprises means for sampling and holding said output from said corresponding voltage selecting means.

7. The drive circuit of claim 6, wherein said digital video signal is updated each period of time T, and each of said means for sampling and holding is operative to sample said output from said corresponding voltage selecting means substantially continuously for a time greater than T.

8. The drive circuit of claim 7, wherein each of said means for sampling and holding is operative to sample said output from said corresponding voltage selecting means substantially continuously for a period equal to M times T.

9. The drive circuit of claim 7, wherein said outputs of said respective voltage selecting means are updated each period of time equal to M times T.

10. The drive circuit of claim 9 wherein each of said outputs of said voltage selecting means is coupled to said signal voltage inputs of corresponding signal voltage hold circuits, the number of said corresponding signal voltage hold circuits being equal to N divided by M.

11. The drive circuit of claim 9, wherein said signal voltage hold circuits are sequentially ordered, and every Mth signal hold circuit in said sequence receives as said signal voltage input the output of a corresponding Mth one of said voltage selecting means.

12. The drive circuit of claim 9, wherein M is substantially less than N/2.

13. The drive circuit of claim 1 further comprising a selection signal generating means for generating selection signals sequentially, wherein said signal voltage input of said signal voltage hold circuit receives a corresponding one of said selection signals by which said signal voltage input becomes conductive, a duration of one of said selection signals being overlapped with a duration of the next one of said selection signals, the duration of each of said selection signals being equal to T times M, T being a period in which said digital video signal is updated.

14. A drive circuit for a display, the drive circuit comprising:
   a plurality N of signal lines for coupling video data to said display;

voltage supplying means for supplying a plurality of signal voltages, the levels of said signal voltages being different;

a plurality M of voltage selecting means connected to said voltage supplying means, each of said voltage selecting means for receiving and digitally sampling a digital video signal, for decoding said sampled digital video signal and for providing as an output one of said plurality of signal voltages based on said decoded digital video signal and in synchronization therewith;

a signal voltage hold circuit for each of said plurality of signal lines, each of said signal voltage hold circuits comprising a signal voltage output coupled to a respective signal line, and a signal voltage input for receiving and sampling the output from a corresponding one of said plurality of voltage selecting means in synchronization with said one of said plurality of signal voltages provided thereon, said signal voltage hold circuit being capable of controllably providing said output received from said corresponding one of said plurality of voltage selecting means to said signal line by way of said signal voltage output; and wherein the value of M is less than the value of N/2, and at least two of said signal voltage hold circuits are connected to the same corresponding voltage selecting means.

* * * * *

UNITED STATES PATENT AND TRADEMARK OFFICE
CERTIFICATE OF CORRECTION

PATENT NO. : 5,440,323

DATED : August 8, 1995

INVENTOR(S) : Hisao Okada

It is certified that error appears in the above-identified patent and that said Letters Patent is hereby corrected as shown below:

Column 9, line 67, please change "th" to --the--.

Column 10, line 14, please change "1M" to --1/M--.

Signed and Sealed this

Fifth Day of March, 1996

*Attest:*

BRUCE LEHMAN

*Attesting Officer*     Commissioner of Patents and Trademarks